United States Patent
Matsubara et al.

(10) Patent No.: US 9,172,333 B2
(45) Date of Patent: Oct. 27, 2015

(54) DISTORTION COMPENSATION DEVICE AND DISTORTION COMPENSATION METHOD

(71) Applicant: FUJITSU LIMITED, Kawasaki-shi, Kanagawa (JP)

(72) Inventors: Satoshi Matsubara, Kawasaki (JP); Mitsuharu Hamano, Sendai (JP); Hideharu Shako, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 152 days.

(21) Appl. No.: 14/010,064

(22) Filed: Aug. 26, 2013

(65) Prior Publication Data

US 2014/0145788 A1    May 29, 2014

(30) Foreign Application Priority Data

Nov. 29, 2012   (JP) ................. 2012-261682

(51) Int. Cl.
| | |
|---|---|
| H03F 1/26 | (2006.01) |
| H03F 1/32 | (2006.01) |
| H03F 3/189 | (2006.01) |
| H03F 3/24 | (2006.01) |

(52) U.S. Cl.
CPC ............ *H03F 1/3241* (2013.01); *H03F 1/3258* (2013.01); *H03F 3/189* (2013.01); *H03F 3/24* (2013.01); *H03F 2200/336* (2013.01); *H03F 2201/3233* (2013.01)

(58) Field of Classification Search
CPC ..................................................... H03F 1/3241
USPC .................. 330/149; 375/296–297; 455/114.3
See application file for complete search history.

(56) References Cited

U.S. PATENT DOCUMENTS

2007/0296495 A1   12/2007  Shako et al.
2011/0227644 A1    9/2011  Matsubara et al.

FOREIGN PATENT DOCUMENTS

| JP | 2003-218970 | 7/2003 |
| JP | 2004-112218 | 4/2004 |
| JP | 2011-199428 | 10/2011 |
| WO | 2006-095422 | 9/2006 |

*Primary Examiner* — Khanh V Nguyen
*Assistant Examiner* — Khiem Nguyen
(74) *Attorney, Agent, or Firm* — Fujitsu Patent Center

(57) ABSTRACT

A distortion compensation device includes a storage unit, an address generator, and a distortion compensation processor. The storage unit stores therein a distortion compensation coefficient for compensating distortion generated in an amplifier for amplifying an input signal. The address generator generates a first address based on a power value of the signal at a current time. Furthermore, the address generator delays, every time a new augend is input, the sum of the power value of the signal at the current time and the augend. The address generator generates a second address based on the sum obtained by calculating a new augend, from the delayed sum. The distortion compensation processor acquires a distortion compensation coefficient corresponding to a combination of the first address and the second address from the storage unit and performs distortion compensation processing on the signal by using the acquired distortion compensation coefficient.

5 Claims, 8 Drawing Sheets

DISTORTION COMPENSATION DEVICE AND DISTORTION COMPENSATION METHOD

CROSS-REFERENCE TO RELATED APPLICATION

This application is based upon and claims the benefit of priority of the prior Japanese Patent Application No. 2012-261682, filed on Nov. 29, 2012, the entire contents of which are incorporated herein by reference.

FIELD

The embodiments discussed herein are directed to a distortion compensation device and a distortion compensation method.

BACKGROUND

In recent years, high-efficiency transfer with digitalization has been employed widely in wireless communication. When a multi-value phase modulation system is applied to wireless communication as a method of executing high-efficiency transfer, widely performed is a technique in which a transmission side, in particular, linearizes an input/output characteristic of an amplifier, and suppresses non-linear distortion so as to reduce leakage power to adjacent channels. When power efficiency is tried to be improved while using an amplifier having deteriorated linearity, non-linear distortion that is generated by the amplifier is preferably compensated.

In mobile communication such as the wideband code division multiple access (W-CDMA), transmission power of a transmission apparatus is ten mW to several tens W and the input/output characteristic of a power amplifier has non-linearity. The input/output characteristic of the power amplifier in this case is expressed by a distortion function f(p). This non-linear characteristic generates non-linear distortion and a frequency spectrum around a transmission frequency f(0) has a raised side lobe. This causes leakage of the power to the adjacent channels, resulting in adjacent interference. That is, the non-linear distortion increases electric power of a transmission wave that leaks to the adjacent frequency channels. The magnitude of the leakage power is expressed by an adjacent channel power ratio (ACPR) as a ratio between electric power in the channel of the own apparatus at a frequency centered at f(0) and adjacent leakage power leaked to the adjacent channels. This indicates that when the adjacent leakage power is larger than the electric power in the channel of the own apparatus, the leakage power is considered to be increased. The leakage power affects other channels as noise and deteriorates communication quality of the other channels affected by the leakage power.

The leakage power is small on a linear region on the input/output characteristic of the power amplifier, for example, and is large on a non-linear region. In order to increase output of the power amplifier, it is considered that the linear region on the input/output characteristic of the power amplifier is made larger. Although it is considered that an amplifier having a high capacity is used in order to make the linear region larger, cost is increased and the apparatus is increased in size.

For solving this problem, a distortion compensation device employing a digital linearity distortion compensation system is provided on a wireless communication apparatus in some cases in order to suppress distortion of a transmission signal that has passed through the amplifier. The digital linearity distortion compensation system is a distortion compensation system of detecting a carrier wave obtained by quadrature modulation with a modulation signal in a feedback manner, digital-converting amplitudes of the modulation signal (transmission baseband signal) and a feedback signal (feedback baseband signal) to compare these signals, and updating a distortion compensation coefficient based on the comparison result sequentially. For example, the distortion compensation device employing the digital linearity distortion compensation system obtains an inverse characteristic of an amplification characteristic by using the distortion compensation coefficient. Then, the distortion compensation device employing the digital linearity distortion compensation system applies distortion of the inverse characteristic of the amplification characteristic to the transmission signal before being input to the amplifier. The application of the distortion of the inverse characteristic suppresses distortion of the transmission signal that has passed through the amplifier, so that non-linearity of the amplifier is compensated.

As the distortion compensation device, there is a distortion compensation device that stores a plurality of distortion compensation coefficients to be used for distortion compensation in a lookup table (LUT) and reads the distortion compensation coefficient from the LUT by specifying an address in accordance with a power value of a transmission signal, for example. The distortion compensation device generates an LUT address for compensating non-linearity of the amplifier in accordance with the power value, the amplitude, or the phase of the signal, for example.

It is known that a phenomenon of a memory effect on the amplifier occurs. The memory effect is an effect that the output of the amplifier at a certain time is affected by input in the past due to an electric transient response called Idsp drift. If the memory effect of the amplifier is generated, it is difficult for the distortion compensation device that generates only the LUT address in accordance with the power value of the signal at the current time to maintain distortion compensation performance.

For solving this, proposed has been a technique of generating a second LUT address in consideration of variation of power values of signals in the past in addition to a first LUT address in accordance with the power value of the signal at the current time. In the technique, the second LUT address is generated by using a simple moving average value or a weighted moving average value obtained by averaging the power value of the signal at the current time and the power values of the signals in the past and the distortion compensation coefficient is read from the LUT by using the first and second LUT addresses. This reproduces non-linearity of the amplifier in accordance with an instantaneous value of the electric power of the signal by using the distortion compensation coefficient with high accuracy and suppresses the generation of the memory effect due to the electric transient response on the amplifier. This makes it possible to maintain distortion compensation performance.

Patent Document 1: Japanese Laid-open Patent Publication No. 2011-199428.

The related techniques do not consider to suppress increase in a circuit size while maintaining distortion compensation performance. To be more specific, in the related technique of generating the LUT address by using the simple moving average value or the weighted moving average value, a plurality of sample values obtained by delaying the current signal temporally are generated on the assumption of calculation of the simple moving average value or the weighted moving average value. That is, a plurality of delay circuits are used in the related technique. This arises a risk of an increased circuit size. Furthermore, the related technique uses a plurality of memories for holding a plurality of weighting coefficients to calculate the weighted moving average value. This also increases the circuit size.

SUMMARY

According to an aspect of an embodiment, a distortion compensation device includes a storage unit that stores therein a distortion compensation coefficient for compensating distortion generated in an amplifier for amplifying an input signal so as to correspond to a combination of two addresses; an address generator that generates a first address for acquiring the distortion compensation coefficient from the storage unit based on a power value of the signal at a current time and generates a second address different from the first address, every time a new augend is input, based on a sum of the power value of the signal at the current time and the augend, the sum being obtained by delaying the sum by a certain time and calculating a new augend that is smaller than the delayed sum delayed by the certain time, from the delayed sum; and a distortion compensation processor that acquires a distortion compensation coefficient corresponding to a combination of the first address and the second address from the storage unit and performs distortion compensation processing on the signal that is input to the amplifier by using the acquired distortion compensation coefficient.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Note that the following embodiments do not limit the distortion compensation device and the distortion compensation method disclosed by the present application.

[a] First Embodiment

Figure 1:
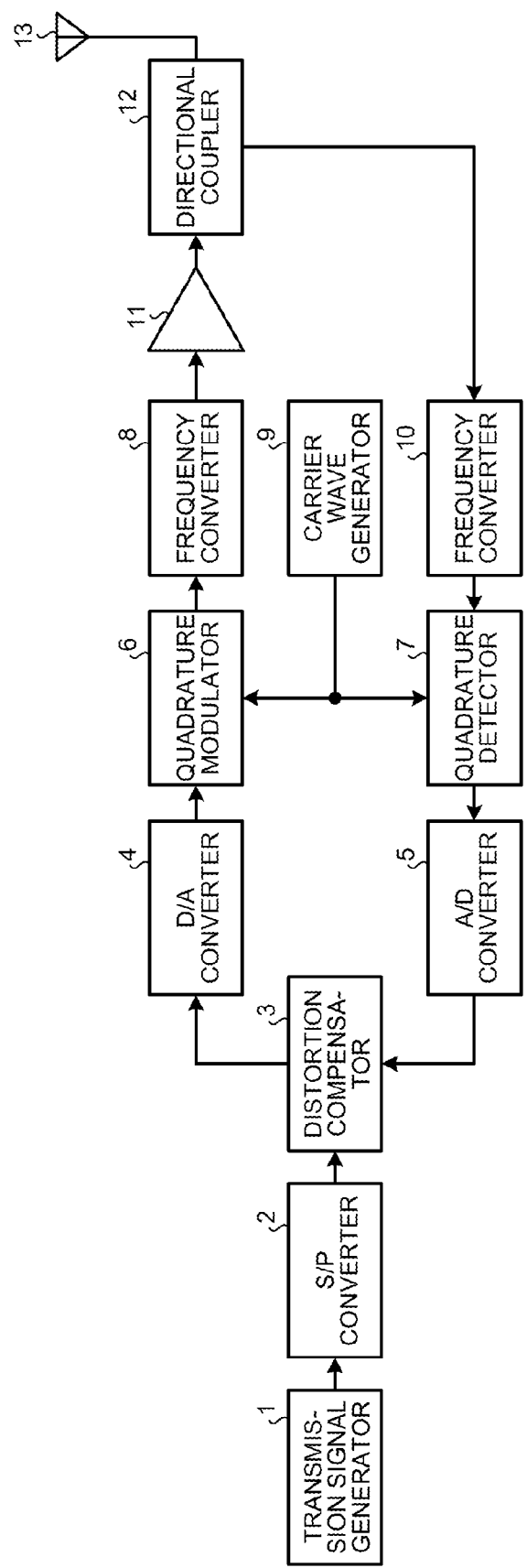
FIG. 1 is a diagram illustrating a configuration of a transmission apparatus including a distortion compensation device according to a first embodiment.

FIG. 1 is a diagram illustrating a configuration of a transmission apparatus including the distortion compensation device according to a first embodiment. The transmission apparatus according to the embodiment includes a transmission signal generator 1, a serial-to-parallel (S/P) converter 2, a distortion compensator 3, a digital-to-analog (D/A) converter 4, and an analog-to-digital (A/D) converter 5. Furthermore, the transmission apparatus according to the embodiment includes a quadrature modulator 6, a quadrature detector 7, a frequency converter 8, a carrier wave generator 9, a frequency converter 10, an amplifier 11, a directional coupler 12, and an antenna 13.

The transmission signal generator 1 generates a serial digital data sequence. Then, the transmission signal generator 1 inputs the generated data sequence to the S/P converter 2.

The S/P converter 2 receives the input of the serial digital data sequence from the transmission signal generator 1. Then, the S/P converter 2 distributes the received digital data sequence on a bit-by-bit basis alternately and outputs it to the distortion compensator 3 so as to convert the digital data sequence into two series of in-phase component signals (I components) and quadrature component signals (Q components).

The distortion compensator 3 receives the input of the transmission signal divided into the I components and the Q components from the S/P converter 2. Furthermore, the distortion compensator 3 receives input of a feedback modulation signal (feedback signal) from the A/D converter 5, which will be described later. Then, the distortion compensator 3 calculates a distortion compensation coefficient based on the difference between the transmission signal and the feedback modulation signal. Thereafter, the distortion compensator 3 stores the calculated distortion compensation coefficient in an address corresponding to each discrete power of the transmission signal so as to update an LUT.

Furthermore, the distortion compensator 3 generates two addresses on the LUT that correspond to electric power of the received transmission signal. Then, the distortion compensator 3 acquires the distortion compensation coefficient corresponding to the generated two addresses from the LUT. The acquired distortion compensation coefficient is a distortion compensation coefficient in accordance with a power level of the transmission signal. The distortion compensator 3 performs distortion compensation processing on the transmission signal that is input to the amplifier 11 by using the acquired distortion compensation coefficient. Thereafter, the distortion compensator 3 outputs the transmission signal on which the distortion compensation processing has been performed to the D/A converter 4. Details of the generation of the addresses and the distortion compensation by the distortion compensator 3 are described in detail later.

The D/A converter 4 receives the input of the transmission signal having the I components and the Q components from the distortion compensator 3. Then, the D/A converter 4 converts the I components and Q components that have been received into analog baseband signals. Thereafter, the D/A converter 4 outputs the baseband signals to the quadrature modulator 6.

The carrier wave generator 9 generates a reference carrier wave. Then, the carrier wave generator 9 outputs the generated carrier wave to the quadrature modulator 6 and the quadrature detector 7.

The quadrature modulator 6 receives the input of the baseband signals from the D/A converter 4. The quadrature modulator 6 receives the input of the reference carrier wave from the carrier wave generator 9. The quadrature modulator 6 multiplies the I components of the received baseband signals by the reference carrier wave. In addition, the quadrature modulator 6 multiplies the Q components of the received baseband signals by a carrier wave obtained by phase-shifting the reference carrier wave by 90 degrees. Then, the quadrature modulator 6 adds the respective multiplied results so as to perform quadrature conversion. Thereafter, the quadrature modulator 6 outputs a quadrature modulation signal as the baseband signal on which the quadrature conversion has been performed to the frequency converter 8.

The frequency converter 8 receives the input of the quadrature modulation signal from the quadrature modulator 6. Then, the frequency converter 8 mixes the received quadrature modulation signal and a local oscillation signal and converts the signal into a signal having a wireless frequency. Then, the frequency converter 8 outputs the signal having the wireless frequency to the amplifier 11.

The amplifier 11 receives the input of the signal having the wireless frequency from the frequency converter 8. Then, the amplifier 11 amplifies electric power of the received signal. Thereafter, the amplifier 11 outputs the amplified signal to the directional coupler 12.

The directional coupler 12 transmits a part of the signal received from the amplifier 11 through the antenna 13. Furthermore, the directional coupler 12 outputs a part of the signal received from the amplifier 11 to the frequency converter 10.

The frequency converter 10 receives the input of the signal same as the signal transmitted through the antenna 13 from the directional coupler 12. Then, the frequency converter 10 performs frequency conversion on the received signal by using the local oscillation signal. The frequency converter 10 outputs a quadrature modulation signal on which the frequency conversion has been performed to the quadrature detector 7.

The quadrature detector 7 receives the input of the quadrature modulation signal on which the frequency converter 10 has performed the frequency conversion. Then, the quadrature detector 7 multiplies the received quadrature modulation signal by the respective reference carrier waves of which phases are different by 90 degrees so as to perform quadrature detection. The quadrature detector 7 outputs the I components and the Q components obtained by the quadrature detection to the A/D converter 5.

The A/D converter 5 receives the input of the I components and the Q components from the quadrature detector 7. Then, the A/D converter 5 converts the received I components and Q components into digital signals. Thereafter, the A/D converter 5 outputs the I components and the Q components converted into the digital signals to the distortion compensator 3.

Figure 2:
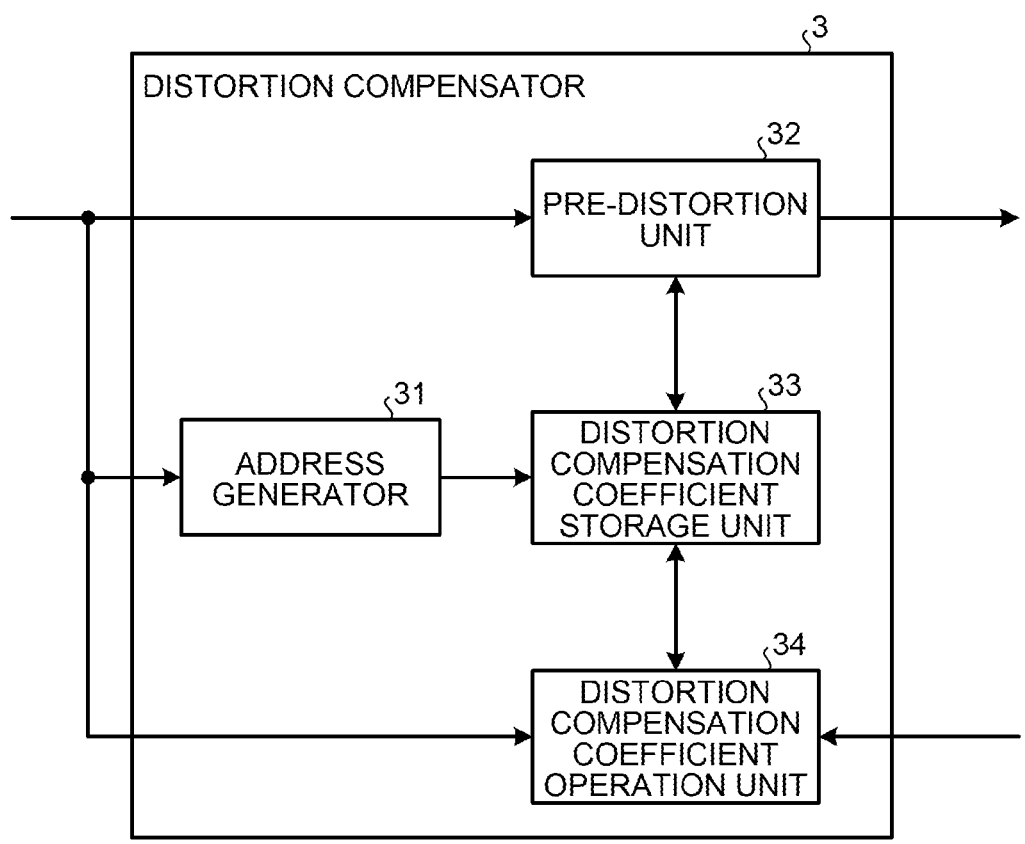
FIG. 2 is a configuration diagram illustrating details of a distortion compensator.

Next, described are details of the distortion compensator 3 with reference to FIG. 2. FIG. 2 is a configuration diagram illustrating the details of the distortion compensator.

As illustrated in FIG. 2, the distortion compensator 3 includes an address generator 31, a pre-distortion unit 32, a distortion compensation coefficient storage unit 33, and a distortion compensation coefficient operation unit 34.

The address generator 31 generates a first address for acquiring a distortion compensation coefficient from the distortion compensation coefficient storage unit 33 based on a power value of the current transmission signal that is input from the S/P converter 2. Furthermore, the address generator 31 obtains an exponential moving average value of the current transmission signal that is input from the S/P converter 2 and generates a second address that is different from the first address based on the obtained exponential moving average value. The address generator 31 outputs a combination of the first address and the second address as address specification information to the distortion compensation coefficient storage unit 33. The configuration of the address generator 31 is described in detail later.

The distortion compensation coefficient storage unit 33 stores therein a lookup table (LUT) in which two-dimensional addresses and the distortion compensation coefficients are made to correspond to each other. The distortion compensation coefficient is a coefficient for compensating distortion that is generated in the amplifier 11. The two-dimensional address is an address indicating the combination of the first address and the second address.

The distortion compensation coefficient storage unit 33 receives the input of the address specification information from the address generator 31. The distortion compensation coefficient storage unit 33 reads the distortion compensation coefficient corresponding to the combination of the first address and the second address that is specified by the address specification information when receiving a request from the pre-distortion unit 32. The distortion compensation coefficient storage unit 33 outputs the read distortion compensation coefficient to the pre-distortion unit 32.

The pre-distortion unit 32 receives the input of the transmission signal from the S/P converter 2. The pre-distortion unit 32 requests the distortion compensation coefficient storage unit 33 to acquire the distortion compensation coefficient for the received transmission signal. The pre-distortion unit 32 receives the input of the distortion compensation coefficient for the received transmission signal from the distortion compensation coefficient storage unit 33. The pre-distortion unit 32 performs distortion compensation processing on the received transmission signal, that is, the transmission signal that is input to the amplifier 11 by using the distortion compensation coefficient. The pre-distortion unit 32 outputs the transmission signal on which the distortion compensation processing has been performed to the D/A converter 4.

The distortion compensation coefficient operation unit 34 receives the input of the transmission signal from the S/P converter 2. The distortion compensation coefficient operation unit 34 receives input of a feedback modulation signal from the A/D converter 5. The distortion compensation coefficient operation unit 34 compares the transmission signal before distortion compensation with the feedback modulation signal by adaptive signal processing by using the least mean square (LMS) and calculates the distortion compensation coefficient such that the difference therebetween is 0. The distortion compensation coefficient operation unit 34 updates the coefficient stored in the LUT included by the distortion compensation coefficient storage unit 33 by using the calculated distortion compensation coefficient.

In this manner, the distortion compensator 3 updates the distortion compensation coefficient adaptively such that the difference between the feedback modulation signal as a part of the signal amplified by the amplifier 11 and the transmission signal before the distortion compensation is 0.

Figure 3:
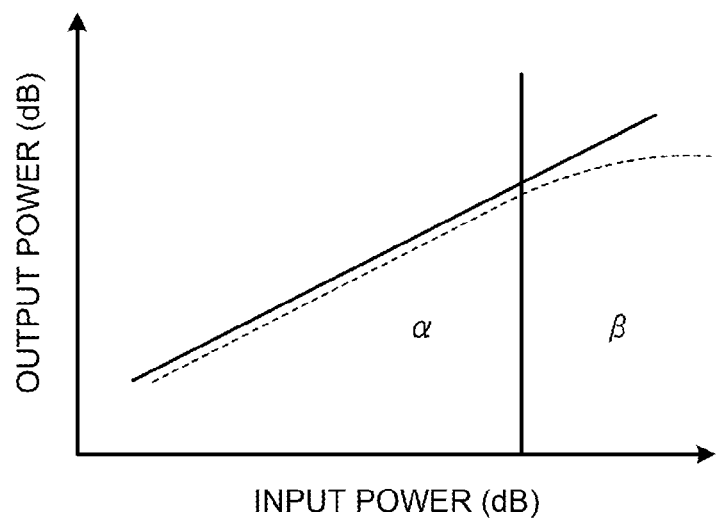
FIG. 3 is a graph illustrating an input/output characteristic of an amplifier.
Figure 4:
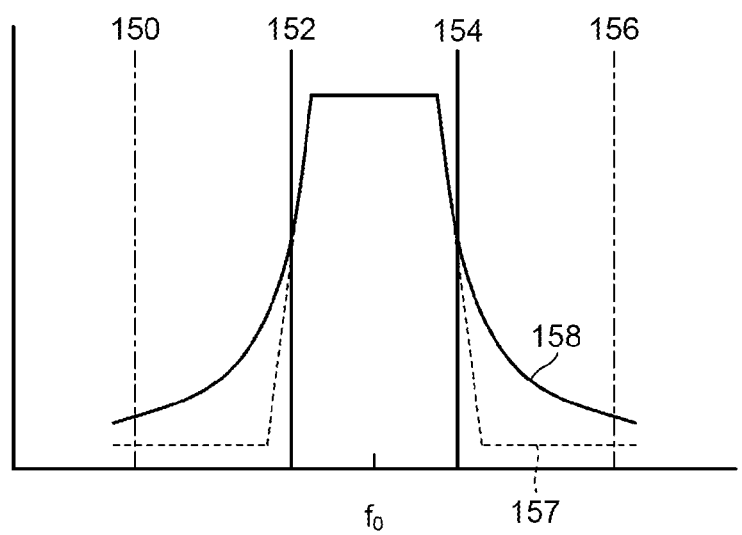
FIG. 4 is a graph for explaining non-linear distortion that is generated by a non-linear characteristic.

Next, described is non-linear distortion that is generated by the input/output characteristic and the non-linear characteristic of the amplifier. FIG. 3 is a graph illustrating the input/output characteristic of the amplifier. FIG. 4 is a graph for explaining the non-linear distortion that is generated by the non-linear characteristic.

For example, in the mobile communication such as the W-CDMA, the transmission power of the wireless apparatus is as much as ten mW to several tens W and the input/output characteristic (having the distortion function f(p)) of the amplifier 11 is non-linear characteristic as indicated by a dotted line in FIG. 3. The non-linear characteristic generates non-linear distortion and the frequency spectrum around the transmission frequency $f_0$ has side lobes as in the characteristic indicated by a solid line 158 that are raised from the characteristic indicated by a dashed line 157 in FIG. 4. In this manner, the transmission signal leaks to adjacent channels, resulting in adjacent interference. That is, the non-linear distortion as illustrated in FIG. 3 increases the electric power that leaks to the adjacent frequency channels as illustrated in FIG. 4.

An adjacent channel power ratio (ACPR) indicating the magnitude of the leakage power is a ratio of electric power in the channel of interest corresponding to a spectrum area of frequency bandwidths from 152 to 154 in FIG. 4 and adjacent leakage power corresponding to a spectrum area that leaks to the adjacent channels of frequency bandwidths from 150 to 156. The leakage power, which can affect other channels as noise and deteriorate communication quality of other channels, is regulated strictly.

The leakage power is small in a linear region (linear region $\alpha$ in FIG. 3) of a power amplifier and is large in a non-linear region $\beta$, for example. Based on this, in a transmission power amplifier of high output, it is desirable to have a wide linear region $\alpha$. This requires an amplifier having a higher capacity than that actually needed and this is disadvantageous in the cost and the size of the apparatus. For solving this, provided is the distortion compensator 3 for compensating the distortion of the transmission power on the transmission apparatus as described above.

Figure 5:
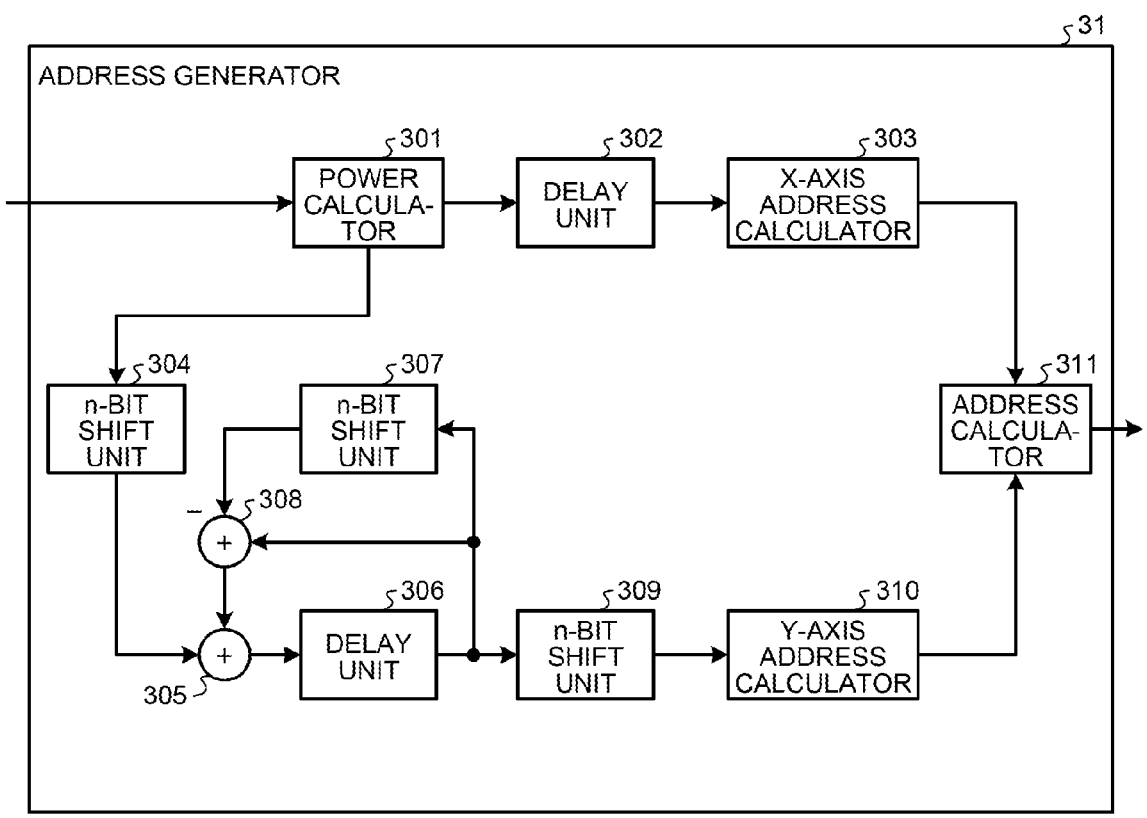
FIG. 5 is a configuration diagram illustrating details of an address generator.

Next, described are details of the address generator 31 with reference to FIG. 5. FIG. 5 is a configuration diagram illustrating the details of the address generator.

The address generator 31 generates a first address based on a power value of the current transmission signal that is input from the S/P converter 2. Furthermore, the address generator 31 obtains an exponential moving average value of the power value of the current transmission signal that is input from the S/P converter 2 and generates a second address based on the obtained exponential moving average value. To be more specific, the address generator 31 includes a power calculator 301, a delay unit 302, and an X-axis address calculator 303, as illustrated in FIG. 5. Furthermore, the address generator 31 includes an n-bit shift unit 304, an adder 305, a delay unit 306, an n-bit shift unit 307, an adder 308, an n-bit shift unit 309, a Y-axis address calculator 310, and an address calculator 311.

The power calculator 301 calculates the power value of the current transmission signal that is input from the S/P converter 2. For example, if the transmission signal at a time t is assumed to be x(t), the power calculator 301 calculates electric power $p=|x(t)|^2$ of the transmission signal. The power value of the transmission signal is hereinafter referred to as a "transmission power value". The power calculator 301 outputs the calculated current transmission power value to the delay unit 302 and the n-bit shift unit 304.

The delay unit 302 receives the input of the transmission power value from the power calculator 301. The delay unit 302 delays the transmission power value and outputs the delayed transmission power value to the X-axis address calculator 303. A time by which the delay unit 302 delays the transmission power value corresponds to a processing time by the n-bit shift unit 304, the adder 305, the delay unit 306, the n-bit shift unit 307, the adder 308, the n-bit shift unit 309, and the Y-axis address calculator 310.

The X-axis address calculator 303 receives the input of the transmission power value from the delay unit 302. The X-axis address calculator 303 normalizes the received transmission power value so as to generate an X-axis directional address as a two-dimensional directional address in accordance with the transmission power value. The X-axis directional address is an example of the first address. The X-axis address calculator 303 outputs the generated X-axis directional address to the address calculator 311.

The n-bit shift unit 304 receives the input of the transmission power value from the power calculator 301. The n-bit shift unit 304 shifts the transmission power value to the left by n (n is an arbitrary natural number). The shift to the left by n bits indicates that a target value is shifted in the direction toward a most significant bit of the value from a least significant bit thereof by n bits. The shift of the target value to the left by n bits corresponds to multiplication of the target value by $2^n$. That is, the n-bit shift unit 304 shifts the transmission power value to the left by n bits so as to multiply the transmission power value by $2^n$. When the n-bit shift unit 304 multiplies the transmission power value by $2^n$, the number of digits of an integer portion of the transmission power value is increased, thereby improving accuracy of an operation result by the operation by using the transmission power value. The n-bit shift unit 304 outputs the transmission power value shifted to the left by n bits to the adder 305. The transmission power value shifted to the left by n bits is hereinafter referred to as a "left-shifted power value". The left-shifted power value is an example of the power value of the current signal.

The adder 305 receives the input of the left-shifted power value from the n-bit shift unit 304. The adder 305 receives input of an augend, which will be described later, from the adder 308. Every time the adder 308 inputs a new augend, the adder 305 adds the left-shifted power value and the augend. The value obtained by adding the left-shifted power value and the augend is hereinafter referred to as a "power sum". The power sum is an example of a sum. The adder 305 outputs the obtained power sum to the delay unit 306.

The delay unit 306 receives the input of the power sum from the adder 305. The delay unit 306 delays the power sum by one sample. For example, if the power sum at a time t is assumed to be psum(t), the delayed power sum delayed by one sample by the delay unit 306 is expressed as psum(t−1). The delayed power sum delayed by one sample by the delay unit 306 is hereinafter referred to as a "delayed power sum". The delayed power sum is an example of the delayed sum delayed by a certain time. The delayed power sum corresponds to an exponential moving average value obtained by performing exponential moving averaging on the current transmission power value and the past transmission power values. The delay unit 306 outputs the obtained delayed power sum to the n-bit shift unit 307, the adder 308, and the n-bit shift unit 309.

The n-bit shift unit 307 receives the input of the delayed power sum from the delay unit 306. The n-bit shift unit 307 shifts the delayed power sum to the right thereof by n bits. The shift to the right by n bits indicates that a target value is shifted in the direction toward a least significant bit of the value from a most significant bit by n bits. The shift of the target value to the right by n bits corresponds to multiplication of the target value by $\frac{1}{2}^n$. That is, the n-bit shift unit 307 shifts the delayed power sum to the right by n bits so as to multiply the delayed power sum by $\frac{1}{2}^n$. The n-bit shift unit 307 outputs the delayed power sum shifted to the right by n bits to the adder 308. The delayed power sum shifted to the right by n bits is hereinafter referred to as a "right-shifted sum".

The adder 308 receives the input of the right-shifted sum from the n-bit shift unit 307. The adder 308 receives the input of the delayed power sum from the delay unit 306. The adder 308 flips a sign of the right-shifted sum and adds the right-shifted sum of which sign has been flipped and the delayed power sum so as to calculate a new augend that is smaller than the delayed power sum. In other words, the adder 308 subtracts the right-shifted sum from the delayed power sum so as to calculate a new augend. The adder 308 outputs the augend that has been calculated newly to the adder 305.

The n-bit shift unit 309 receives the input of the delayed power sum from the delay unit 306. The n-bit shift unit 309 shifts the delayed power sum to the right by n bits. The shift of a target value to the right by n bits indicates that the target value is multiplied by $\frac{1}{2}^n$. That is, the n-bit shift unit 309 shifts the delayed power sum to the right by n bits so as to multiply the delayed power sum by $\frac{1}{2}^n$. When the n-bit shift unit 309 multiplies the delayed power sum by $\frac{1}{2}^n$, the number of digits of an integer portion of the delayed power sum is returned to the number of digits of the integer portion of the transmission power value. The n-bit shift unit 309 outputs the delayed power sum shifted to the right by n bits, that is, outputs the right-shifted sum to the Y-axis address calculator 310.

The Y-axis address calculator 310 receives the input of the right-shifted sum from the n-bit shift unit 309. The Y-axis address calculator 310 normalizes the received right-shifted sum so as to generate an Y-axis directional address as a two-dimensional directional address in accordance with the right-shifted sum. The Y-axis directional address is an example of a second address. The Y-axis address calculator 310 outputs the generated Y-axis directional address to the address calculator 311.

The address calculator 311 receives the input of the X-axis directional address from the X-axis address calculator 303. The address calculator 311 receives the input of the Y-axis directional address from the Y-axis address calculator 310. The address calculator 311 generates a combination of the X-axis directional address and the Y-axis directional address. The combination of the X-axis directional address and the Y-axis directional address is hereinafter referred as a "combination address". For example, the address calculator 311 generates the combination address in which the X-axis directional address and the Y-axis directional address are aligned like "X-axis directional address: Y-axis directional address". The address calculator 311 outputs the generated combination address as address specification information to the distortion compensation coefficient storage unit 33. The combination address contains the X-axis directional address generated based on the power value of the current transmission signal and the Y-axis directional address generated based on the exponential moving average value of the power value of the current transmission signal and the power values of the past transmission signals. In other words, a trend that a weight on the past signal closer to the current signal is larger in an exponential manner is reflected to the combination address as the address specification information on the LUT in the distortion compensation coefficient storage unit 33.

Figure 6:
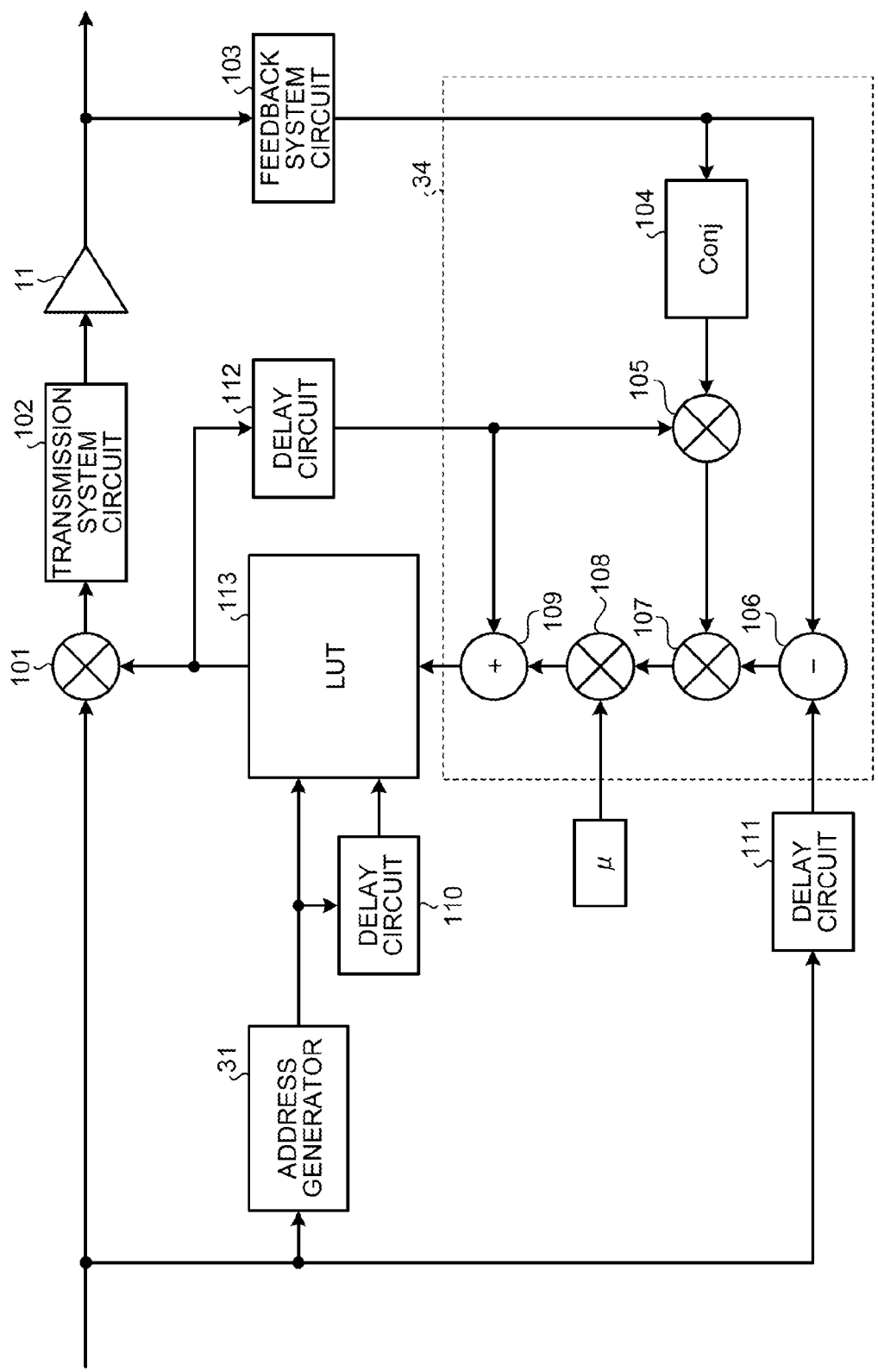
FIG. 6 is a configuration diagram illustrating details of hardware of the distortion compensation device according to the first embodiment.

Next, details of the distortion compensation device according to the embodiment are described more in detail with reference to FIG. 6. FIG. 6 is a configuration diagram illustrating details of hardware of the distortion compensation device according to the first embodiment.

A LUT 113 executes the function of the lookup table included by the distortion compensation coefficient storage unit 33 as illustrated in FIG. 2. Furthermore, a multiplier 101 executes the function of the pre-distortion unit 32 as illustrated in FIG. 2. A complex conjugate signal output unit 104, a multiplier 105, a subtractor 106, a multiplier 107, a multiplier 108, and an adder 109 execute the function of the distortion compensation coefficient operation unit 34 as illustrated in FIG. 2. In FIG. 6, the complex conjugate signal output unit 104 is expressed as "Conj" for the convenience.

The transmission signal transmitted from the S/P converter 2 is input to the multiplier 101, the address generator 31, and a delay circuit 111.

The address generator 31 generates an X-axis directional address based on the power value of the current transmission signal. Furthermore, every time a new augend is input, the address generator 31 delays the sum of the power value of the current transmission signal and the augend by a certain time and calculates a new augend that is smaller than the sum based on the delayed sum delayed by the certain time so as to obtain an exponential moving average value. Then, the address generator 31 generates a Y-axis directional address based on the obtained exponential moving average value. The address generator 31 generates a combination address indicating the combination of the X-axis directional address and the Y-axis directional address. Thereafter, the address generator 31 outputs the generated combination address as address specification information to the LUT 113. Furthermore, the address generator 31 outputs the generated address to the delay circuit 110.

The multiplier 101 acquires a distortion compensation coefficient corresponding to the combination address specified by the address generator 31 from the LUT 113. Furthermore, the distortion compensation coefficient acquired from the LUT 113 is transmitted to a delay circuit 112. The multiplier 101 multiplies the acquired distortion compensation coefficient and the transmission signal and outputs the multiplied result to a transmission system circuit 102. In the embodiment, the combination address specified by the address generator 31 contains the X-axis directional address generated based on the power value of the current transmission signal and the Y-axis directional address generated based on the exponential moving average value of the power value of the current transmission signal and the power values of the past transmission signals. In other words, a trend that a weight on the past signal closer to the current signal is larger in an exponential manner is reflected to the combination address as the address specification information on the LUT 113. For this reason, the distortion compensation processing by the multiplier 101 makes it possible to appropriately suppress non-linear distortion of the amplifier 11 due to the memory effect of which degree increases as the time is closer to the current time.

The transmission system circuit 102 includes the D/A converter 4, the quadrature modulator 6, the frequency converter 8, and the like as illustrated in FIG. 1. The transmission system circuit 102 performs various pieces of processing such as D/A conversion, quadrature modulation, and frequency conversion on the transmission signal on which the multiplier 101 has performed the distortion compensation processing and outputs the processed signal to the amplifier 11.

The amplifier 11 amplifies the transmission signal on which the distortion compensation processing has been performed. Then, the amplifier 11 transmits the amplified transmission signal through the antenna and outputs it to a feedback system circuit 103.

The feedback system circuit 103 includes the A/D converter 5, the quadrature detector 7, the frequency converter 8, and the like as illustrated in FIG. 1. The feedback system circuit 103 outputs a feedback modulation signal on which various pieces of processing such as the frequency conversion, the quadrature detection, and the A/D conversion have been performed on the amplified transmission signal received from the amplifier 11 to the complex conjugate signal output unit 104 and the subtractor 106.

The delay circuits 110 to 112 add the delay time from the time when the transmission signal is input to the amplifier 11 until the feedback modulation signal is input to the subtractor 106 to the time of each input signal. For example, if the delay time on the amplifier 11 is assumed to be D0 and the delay time on the feedback system circuit 103 is assumed to be D1, the delay circuits 110 to 112 add a delay time satisfying D0+D1 to the time of each signal.

The complex conjugate signal output unit 104 calculates a complex conjugate signal of the received feedback modulation signal. Then, the complex conjugate signal output unit 104 outputs the complex conjugate signal to the multiplier 105.

The subtractor 106 subtracts the feedback modulation signal received from the feedback system circuit 103 from the transmission signal received from the delay circuit 111 so as to obtain a difference between the transmission signal received from the delay circuit 111 and the feedback modulation signal. Then, the subtractor 106 outputs the obtained difference to the multiplier 107.

The multiplier 105 multiplies the complex conjugate signal input from the complex conjugate signal output unit 104 and the distortion compensation coefficient input from the delay circuit 112. Then, the multiplier 105 outputs the multiplied result to the multiplier 107.

The multiplier 107 multiplies the difference, which has been input from the subtractor 106, between the feedback modulation signal and the transmission signal and the multiplied result, which has been input from the multiplier 105, of the complex conjugate signal and the distortion compensation coefficient. Then, the multiplier 107 outputs the multiplied result to the multiplier 108.

The multiplier 108 multiplies the value input from the multiplier 107 by a step size parameter μ. Then, the multiplier 108 outputs the multiplied result to the adder 109.

The adder 109 adds the value input from the multiplier 108 and the distortion compensation coefficient input from the delay circuit 112. Then, the adder 109 transmits the added result to the LUT 113.

The LUT 113 updates the value stored in the address input from the delay circuit 110 to the value input from the adder 109. With this, the value stored in the address of the LUT 113 that corresponds to the transmission signal is updated and converged on a value of an optimum distortion compensation coefficient finally, so that distortion of the amplifier 11 is compensated.

Figure 7:
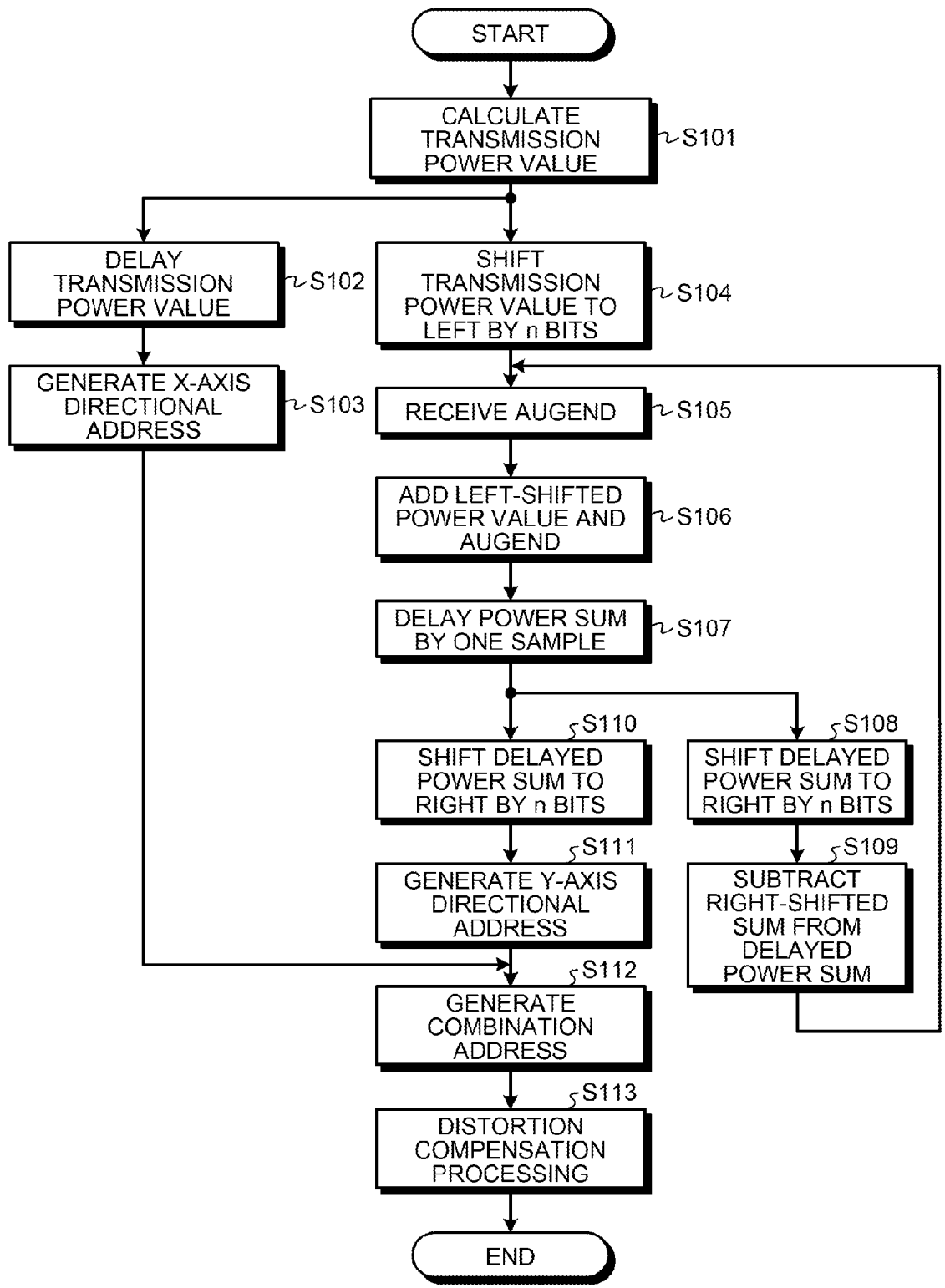
FIG. 7 is a flowchart for explaining the procedure of distortion compensation processing by the distortion compensation device according to the first embodiment.

Next, described is the procedure of the distortion compensation processing by the distortion compensation device according to the embodiment with reference to FIG. 7. FIG. 7 is a flowchart for explaining the procedure of the distortion compensation processing by the distortion compensation device according to the first embodiment.

As illustrated in FIG. 7, the power calculator 301 of the distortion compensator 3 calculates a transmission power value of the current transmission signal that is input (step S101).

The delay unit 302 receives the input of the transmission power value from the power calculator 301. The delay unit 302 delays the transmission power value (step S102).

The X-axis address calculator 303 receives the input of the transmission power value from the delay unit 302. The X-axis address calculator 303 normalizes the transmission power value so as to generate an X-axis directional address as a two-dimensional directional address in accordance with the transmission power value (step S103).

The n-bit shift unit 304 receives the input of the transmission power value from the power calculator 301. The n-bit shift unit 304 shifts the transmission power value to the left by n bits (step S104).

The adder 305 receives the input of the left-shifted power value from the n-bit shift unit 304. When the adder 308 inputs a new augend, the adder 305 receives the input of the augend from the adder 308 (step S105).

The adder 305 adds the left-shifted power value and the augend (step S106). The delay unit 306 receives the input of the power sum from the adder 305. The delay unit 306 delays the power sum by one sample (step S107). The delay unit 306 outputs the obtained delayed power sum to the n-bit shift unit 307, the adder 308, and the n-bit shift unit 309.

The n-bit shift unit 307 receives the input of the delayed power sum from the delay unit 306. The n-bit shift unit 307 shifts the delayed power sum to the right by n bits (step S108).

The adder 308 receives the input of the delayed power sum from the delay unit 306. The adder 308 receives the input of the right-shifted sum from the n-bit shift unit 307. The adder 308 subtracts the right-shifted sum from the delayed power sum so as to calculate a new augend that is smaller than the delayed power sum (step S109). The adder 308 outputs the augend that has been calculated newly to the adder 305 and the processing is returned to step S105.

The n-bit shift unit 309 receives the input of the delayed power sum from the delay unit 306. The n-bit shift unit 309 shifts the delayed power sum to the right by n bits (step S110).

The Y-axis address calculator 310 receives the input of the right-shifted sum from the n-bit shift unit 309. The Y-axis address calculator 310 normalizes the right-shifted sum so as to generate the Y-axis directional address as a two-dimensional directional address in accordance with the right-shifted sum (step S111).

The address calculator 311 receives the input of the X-axis directional address from the X-axis address calculator 303. The address calculator 311 receives the input of the Y-axis directional address from the Y-axis address calculator 310. The address calculator 311 generates a combination address as a combination of the X-axis directional address and the Y-axis directional address (step S112). The address calculator 311 outputs the generated combination address as address specification information to the distortion compensation coefficient storage unit 33.

The pre-distortion unit 32 acquires a distortion compensation coefficient stored in the address that has been specified by the address calculator 311 by using the combination address in the LUT included by the distortion compensation coefficient storage unit 33. Then, the pre-distortion unit 32 performs the distortion compensation processing on the transmission signal by using the acquired distortion compensation coefficient (step S113). The amplifier 11 amplifies the transmission signal on which the pre-distortion unit 32 has performed the distortion compensation processing and transmits the amplified transmission signal through the antenna.

As described above, the distortion compensation device according to the embodiment generates the X-axis directional address based on the power value of the current transmission signal. The distortion compensation device according to the embodiment generates the Y-axis directional address based on the exponential moving average value obtained by repeating the processing of delaying the sum of the power value of the current transmission signal and the augend by one sample and calculating a new augend that is smaller than the value delayed by one sample. Then, the distortion compensation device according to the embodiment performs the distortion compensation processing by using the distortion compensation coefficient corresponding to the combination of the X-axis directional address and the Y-axis directional address. With this, the embodiment makes it possible to appropriately suppress non-linear distortion of the amplifier due to the memory effect of which degree increases in an exponential manner as the time is closer to the current time. Furthermore, the distortion compensation device according to the embodiment repeats the processing of delaying the sum of the power value of the current transmission signal and the augend by one sample and calculating a new augend that is smaller than the value delayed by one sample, thereby reducing the number of delay circuits and memories in comparison with the related technique. That is, the embodiment makes it possible to suppress increase of a circuit size while maintaining distortion compensation performance.

In addition, the distortion compensation device according to the embodiment shifts the delayed sum delayed by one sample to the right by n bits and subtracts the value shifted to the right by n bits from the sum so as to calculate a new augend for the power value of the current transmission signal. With this, the embodiment makes it possible to omit a circuit for calculating a plurality of sample values obtained by temporally delaying the power value of the current transmission signal in comparison with the related technique, thereby suppressing the increase of the circuit size further.

[b] Second Embodiment

Figure 8:
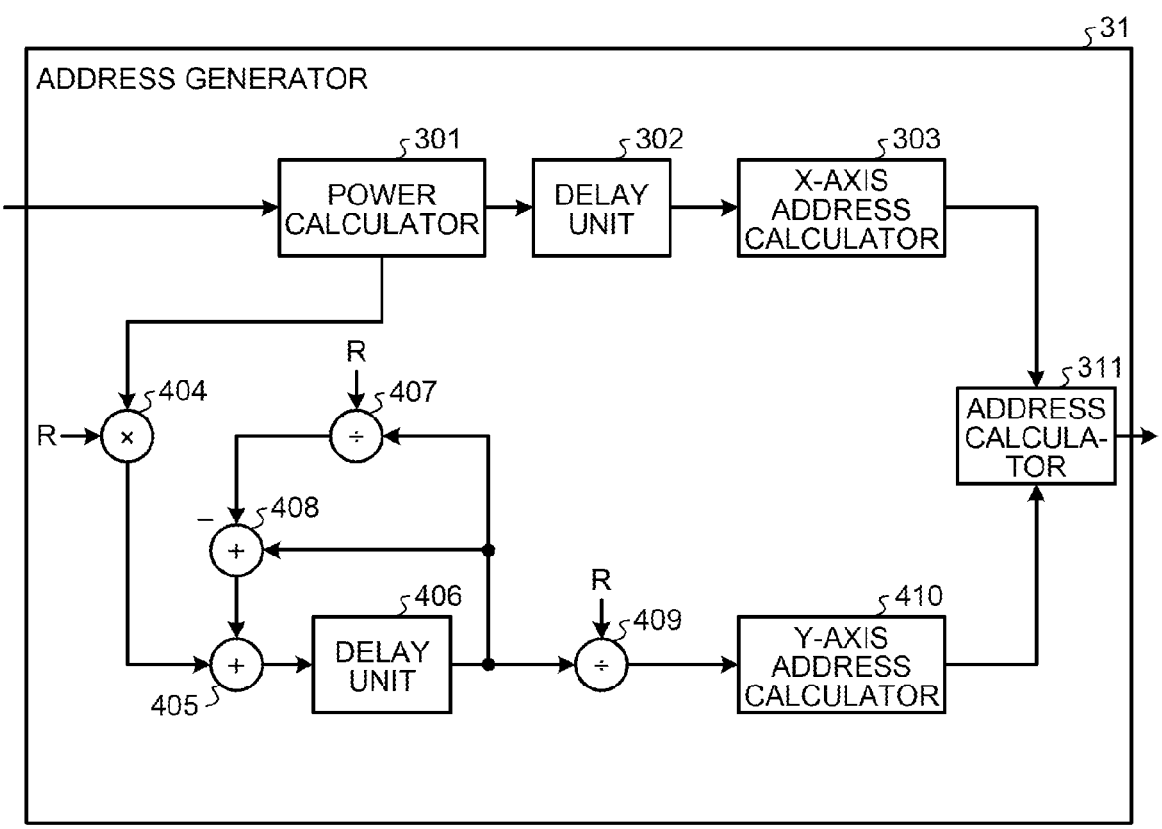
FIG. 8 is a configuration diagram illustrating details of an address generator on a distortion compensation device according to a second embodiment.

FIG. 8 is a configuration diagram illustrating details of an address generator on a distortion compensation device according to a second embodiment. The distortion compensation device according to the embodiment is different from the first embodiment in a method of calculating an augend for a power value of a current transmission signal. The following description omits description of operations of the respective parts that are the same as those in the first embodiment.

As illustrated in FIG. 8, an address generator 31 in the embodiment includes a power calculator 301, a delay unit 302, and an X-axis address calculator 303. Furthermore, the address generator 31 includes a multiplier 404, an adder 405, a delay unit 406, a divider 407, an adder 408, a divider 409, and a Y-axis address calculator 410. Among these members, the power calculator 301, the delay unit 302, and the X-axis address calculator 303 correspond to the power calculator 301, the delay unit 302, and the X-axis address calculator 303 as illustrated in FIG. 5, respectively.

The power calculator 301 calculates a transmission power value of the current transmission signal that is input from the S/P converter 2. The power calculator 301 outputs the calculated current transmission power value to the delay unit 302 and the multiplier 404.

The multiplier 404 receives the input of the transmission power value from the power calculator 301. The multiplier 404 multiplies the transmission power value by R (R is an arbitrary real number) so as to make the transmission power value R-fold. If the multiplier 404 make the transmission power value R-fold, the number of digits of an integer portion of the transmission power value is increased, thereby improving accuracy of the operation result by the operation by using the transmission power value. The multiplier 404 outputs the R-fold transmission power value to the adder 405. The R-fold transmission power value is hereinafter referred to as an "R-fold power value". The R-fold power value is an example of the power value of the current signal.

The adder 405 receives the input of the R-fold power value from the multiplier 404. The adder 405 receives input of an augend, which will be described later, from the adder 408. Every time the adder 408 inputs a new augend, the adder 405 adds the R-fold power value and the augend. The value obtained by adding the R-fold power value and the augend is hereinafter referred to as a "power sum". The power sum is an example of the sum. The adder 405 outputs the obtained power sum to the delay unit 406.

The delay unit 406 receives the input of the power sum from the adder 405. The delay unit 406 delays the power sum by one sample. The delayed power sum delayed by one sample by the delay unit 406 is hereinafter referred to as a "delayed power sum". The delayed power sum is an example of the delayed sum delayed by a certain time. The delayed power sum corresponds to an exponential moving average value obtained by performing exponential moving averaging on the current transmission power value and the past transmission power values. The delay unit 406 outputs the obtained delayed power sum to the divider 407, the adder 408, and the divider 409.

The divider 407 receives the input of the delayed power sum from the delay unit 406. The divider 407 divides the delayed power sum by a certain real number R. A value obtained by dividing the delayed power sum by R is hereinafter referred to as a "1/R-fold sum". The divider 407 outputs the obtained 1/R-fold sum to the adder 408.

The adder 408 receives the input of the 1/R-fold sum from the divider 407. The adder 408 receives the input of the delayed power sum from the delay unit 406. The adder 408 flips a sign of the 1/R-fold sum and adds the 1/R-fold sum of which sign has been flipped and the delayed power sum so as to calculate a new augend that is smaller than the delayed power sum. In other words, the adder 408 subtracts the 1/R-fold sum from the delayed power sum so as to calculate a new augend. The adder 408 outputs the augend that has been calculated newly to the adder 405.

The divider 409 receives the input of the delayed power sum from the delay unit 406. The divider 409 divides the delayed power sum by the certain real number R. When the divider 409 divides the delayed power sum by R, the number of digits of an integer portion of the delayed power sum is returned to the number of digits of the integer portion of the transmission power value. The divider 409 outputs the value obtained by dividing the delayed power sum by R, that is, the 1/R-fold sum to the Y-axis address calculator 410.

The Y-axis address calculator 410 receives the input of the 1/R-fold sum from the divider 409. The Y-axis address calculator 410 normalizes the received 1/R-fold sum so as to generate an Y-axis directional address as a two-dimensional directional address in accordance with the 1/R-fold sum. The Y-axis address calculator 410 outputs the generated Y-axis directional address to the address calculator 311.

The address calculator 311 receives the input of the X-axis directional address from the X-axis address calculator 303. The address calculator 311 receives the input of the Y-axis directional address from the Y-axis address calculator 410. The address calculator 311 generates a combination address indicating the combination of the X-axis directional address and the Y-axis directional address. Then, the address calculator 311 outputs the generated combination address as address specification information to the distortion compensation coefficient storage unit 33. The combination address contains the X-axis directional address generated based on the power value of the current transmission signal and the Y-axis directional address generated based on the exponential moving average value of the power value of the current transmission signal and the power values of the past transmission signals. In other words, a trend that a weight on the past signal closer to the current signal is larger in an exponential manner is reflected to the combination address as the address specification information on the LUT of the distortion compensation coefficient storage unit 33.

Figure 9:
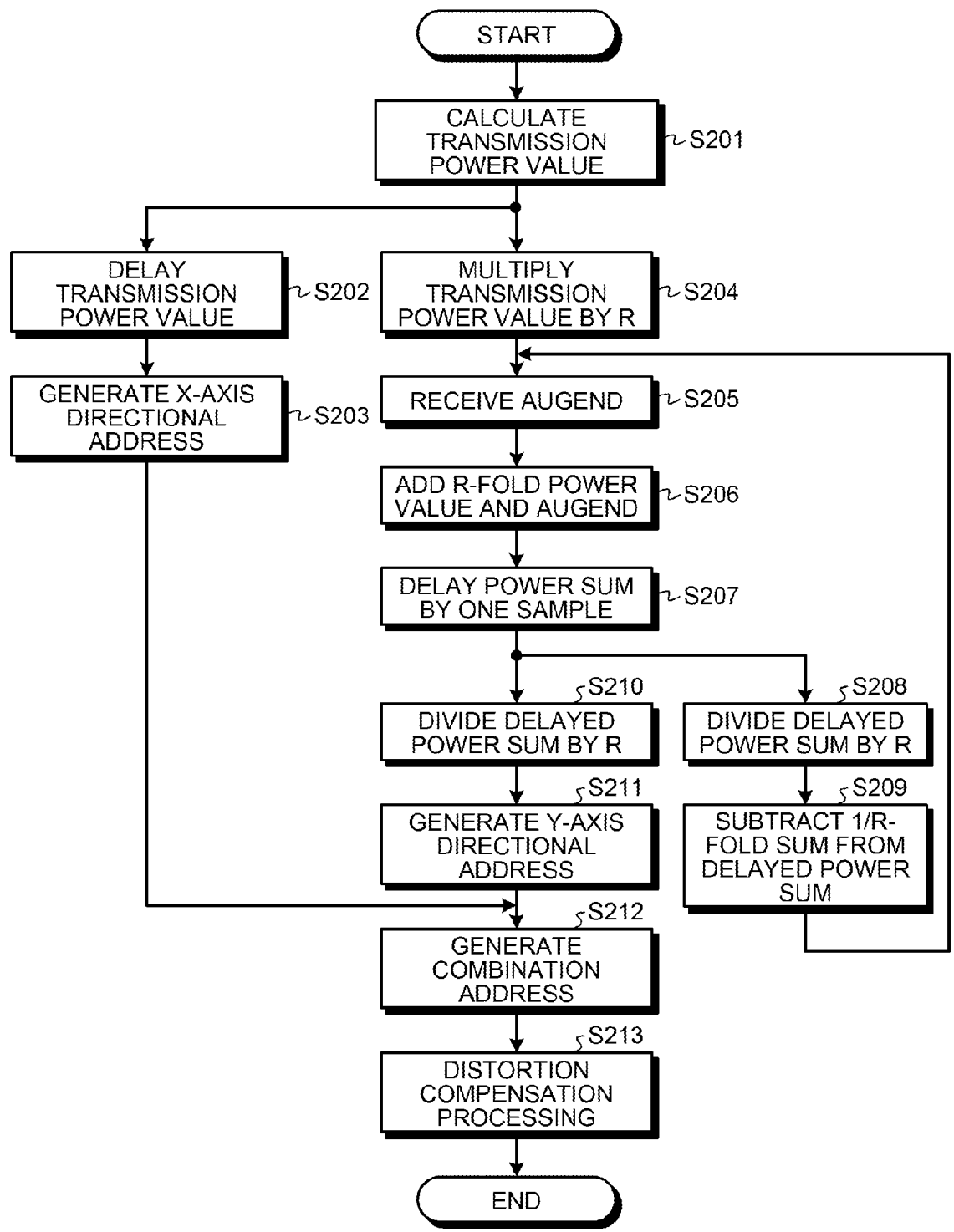
FIG. 9 is a flowchart for explaining the procedure of distortion compensation processing by the distortion compensation device according to the second embodiment.

Next, described is the procedure of the distortion compensation processing by the distortion compensation device according to the embodiment with reference to FIG. 9. FIG. 9 is a flowchart for explaining the procedure of the distortion compensation processing by the distortion compensation device according to the second embodiment. Pieces of processing at steps S201 to S203, S212, and S213 as illustrated in FIG. 9 are the same as the pieces of processing at steps S101 to S103, S112, and S113 as illustrated in FIG. 7, respectively, and description thereof is omitted.

As illustrated in FIG. 9, the multiplier 404 that has received the input of the transmission power value from the power calculator 301 multiplies the transmission power value by a certain real number R (step S204).

The adder 405 receives the input of the R-fold power value from the multiplier 404. When the adder 408 inputs a new augend, the adder 405 receives the input of the augend from the adder 408 (step S205).

The adder 405 adds the R-fold power value and the augend (step S206). The delay unit 406 receives the input of the power sum from the adder 405. The delay unit 406 delays the power sum by one sample (step S207). The delay unit 406 outputs the obtained delayed power sum to the divider 407, the adder 408, and the divider 409.

The divider 407 receives the input of the delayed power sum from the delay unit 406. The divider 407 divides the delayed power sum by the certain real number R (step S208).

The adder 408 receives the input of the delayed power sum from the delay unit 406. The adder 408 receives the input of the 1/R-fold sum from the divider 407. The adder 408 subtracts the 1/R-fold sum from the delayed power sum so as to calculate a new augend that is smaller than the delayed power sum (step S209). The adder 408 outputs the augend that has been calculated newly to the adder 405 and the processing is returned to step S205.

The divider 409 receives the input of the delayed power sum from the delay unit 406. The divider 409 divides the delayed power sum by the certain real number R (step S210).

The Y-axis address calculator 410 receives the input of the 1/R-fold sum from the divider 409. The Y-axis address calculator 410 normalizes the 1/R-fold sum so as to generate a Y-axis directional address as a two-dimensional directional address in accordance with the 1/R-fold sum (step S211).

As described above, the distortion compensation device according to the embodiment subtracts a value obtained by dividing the delayed sum delayed by one sample by the certain real number R from the sum so as to calculate a new augend for the power value of the current transmission signal. With this, the embodiment can calculate the augend for the power value of the current transmission signal as an arbitrary value in accordance with the real number R. This makes it possible to accurately calculate the exponential moving average value and the Y-axis directional address obtained from the sum of the power value of the current transmission signal and the augend. As a result, according to the embodiment, only non-linear distortion of the amplifier due to the memory effect of which degree increases in an exponential manner as the time is closer to the current time can be suppressed with higher accuracy.

In the first and second embodiments, the X-axis directional address is generated based on the power value of the current transmission signal and the Y-axis directional address is generated based on the exponential moving average value obtained by repeating the processing of delaying the sum of the power value of the current transmission signal and the augend by one sample and calculating a new augend. The information as a basis for generating addresses such as the X-axis directional address and the Y-axis directional address is not limited to the power value of the current transmission signal. It is sufficient that the information as a basis for generating addresses is at least any one value of the power value, the amplitude value, and the phase value of the current signal.

One aspect of the distortion compensation device disclosed by the present application can provide an effect of suppressing an increase in a circuit size while maintaining distortion compensation performance.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation device comprising:
    a storage unit that stores therein a distortion compensation coefficient for compensating distortion generated in an amplifier for amplifying an input signal so as to correspond to a combination of two addresses;
    an address generator that generates a first address for acquiring the distortion compensation coefficient from the storage unit based on a power value of a current signal at a current time and generates a second address different from the first address, every time a first augend is input, based on a sum of the power value of the current signal at the current time and an augend, the sum being obtained by delaying the sum by a certain time and calculating a second augend that is smaller than the delayed sum delayed by the certain time, from the delayed sum; and
    a distortion compensation processor that acquires a distortion compensation coefficient corresponding to a combination of the first address and the second address from the storage unit and performs distortion compensation processing on the current signal that is input to the amplifier by using the acquired distortion compensation coefficient.

2. The distortion compensation device according to claim 1, wherein the address generator shifts the delayed sum delayed by the certain time to a right by n (n is an arbitrary natural number) bit and subtracts the sum shifted to the right from the sum before being shifted to the right so as to calculate the second augend.

3. The distortion compensation device according to claim 1, wherein the address generator divides the delayed sum delayed by the certain time by a certain real number and subtracts a value obtained by dividing the sum by the real number from the sum so as to calculate the second augend.

4. The distortion compensation device according to claim 1, wherein the address generator generates the first address based on any one of the power value, an amplitude value, and a phase value of the signal at the current time and generates the second address, every time the first augend is input, based on a sum of any one value of the power value, the amplitude value, and the phase value of the signal at the current time and the augend, the sum being obtained by delaying the sum by a certain time and calculating the second augend that is smaller than the delayed sum delayed by the certain time, from the delayed sum.

5. A distortion compensation method comprising:
generating a first address for acquiring a distortion compensation coefficient from a storage unit that stores therein the distortion compensation coefficient for compensating distortion generated in an amplifier for amplifying an input signal so as to correspond to a combination of two addresses based on a power value of a current signal at a current time that is input to the amplifier;
generating a second address different from the first address, every time a first augend is input, based on a sum of the power value of the current signal at the current time and an augend, the sum being obtained by delaying the sum by a certain time and calculating a second augend that is smaller than the delayed sum delayed by the certain time, from the delayed sum; and
acquiring a distortion compensation coefficient corresponding to a combination of the first address and the second address from the storage unit and performing distortion compensation processing on the current signal that is input to the amplifier by using the acquired distortion compensation coefficient.

* * * * *